United States Patent [19]

van de Ven et al.

[11] Patent Number: 4,476,483

[45] Date of Patent: Oct. 9, 1984

[54] SEMICONDUCTOR DEVICE HAVING A DOPED AMORPHOUS SILICON ADHESIVE LAYER

[75] Inventors: Everhardus P. G. T. van de Ven, Sunnyvale, Calif.; Antonius J. M. Uijen, Nijmegen, Netherlands

[73] Assignee: U.S. Philips Corporation, New York, N.Y.

[21] Appl. No.: 281,760

[22] Filed: Jul. 9, 1981

[30] Foreign Application Priority Data

Jul. 18, 1980 [NL] Netherlands .................. 8004139

[51] Int. Cl.³ .................................. H01L 23/48
[52] U.S. Cl. ................................ 357/71; 357/2; 357/65
[58] Field of Search ................... 357/71, 2, 65, 67; 29/589

[56] References Cited

U.S. PATENT DOCUMENTS 4,251,287 2/1981 Dalal .................................. 357/2

Primary Examiner—James W. Davie
Attorney, Agent, or Firm—Robert T. Mayer; Steven R. Biren

[57] ABSTRACT

The invention relates to a semiconductor device having a disk-shaped semiconductor body in which on the side of a first major surface at least one circuit element is formed and in which a second major surface present opposite to the first major surface is covered with an adhesive layer on which at least one metal layer is provided, which metal layer is bonded to a carrier. According to the invention, the adhesive layer is formed of doped amorphous silicon of the same conductivity type as the semiconductor body on the side of the second major surface.

5 Claims, 2 Drawing Figures

SEMICONDUCTOR DEVICE HAVING A DOPED AMORPHOUS SILICON ADHESIVE LAYER

BACKGROUND OF THE INVENTION

The invention relates to a semiconductor device having a disk-shaped semiconductor body in which on the side of a first major surface at least one circuit element is formed and in which a second major surface present opposite to the first major surface is covered with an adhesive layer on which at least one metal layer is provided which is bonded to a carrier, and to a method of manufacturing the semiconductor device.

Known monocrystalline silicon semiconductor bodies are coated, for example, on the side of the second major surface with an adhesive layer consisting of titanium, chromium or nickel-chromium. For example, metal layers of platinum and gold or nickel and gold are provided on the adhesive layer. Instead of gold, silver may also be used.

The outermost metal layer is connected to a carrier via a glued joint or a pressure bond, which carrier forms an electric connection for the semiconductor body. Soldered joints are also used, which also serve to dissipate heat which is generated in the semiconductor device.

In practice, however, the provision of metal layers on a semiconductor body proves to be expensive, while problems regularly occur as a result of an insufficient adhesion and contacting by the adhesive layer.

SUMMARY OF THE INVENTION

One of the objects of the invention is to avoid or at least minimize the above-mentioned problems. It is based inter alia on the recognition of the fact that adhesive layers can also be manufactured from nonmetallic materials.

According to the invention, a semiconductor device of the type mentioned above is therefore characterized in that the adhesive layer comprises doped amorphous silicon of the same conductivity type as the monocrystalline semiconductor body on the side of the second major surface.

The said amorphous silicon provides good adhesion and contacting properties. By using amorphous silicon as an adhesive layer, simpler systems of metal layers may be used. For bonding the semiconductor body to the carrier, the metal layer preferably comprises soldering material.

As a result of the good adhesion properties of the amorphous silicon, previously used treatments of the monocrystalline semiconductor body to improve adhesion, for example, ion implantation and mechanical treatments for roughening the second major surface, may be omitted. By reducing the number of varying and often product-dependent treatments, a greater degree of manufacturing standardization is possible.

Application to comparatively low-doped semiconductor bodies while maintaining ohmic contacts is possible if the concentration of the conductivity-type-determining dopant in the amorphous silicon layer is larger than the concentration of the dopant determining the conductivity type in the semiconductor body on the side of the second major surface.

A dopant can be incorporated in the amorphous silicon layer at low temperature particularly readily and inexpensively when the layer of doped amorphous silicon is provided by means of a plasma. Preferably a plasma is formed in a gas mixture containing a silicon compound and a compound of a dopant determining the conductivity type.

BRIEF DESCRIPTION OF THE DRAWING

The invention will now be described in greater detail with reference to several embodiments and the accompanying drawing.

In the drawing.

DESCRIPTION OF THE PREFERRED EMBODIMENTS

Figure 1:
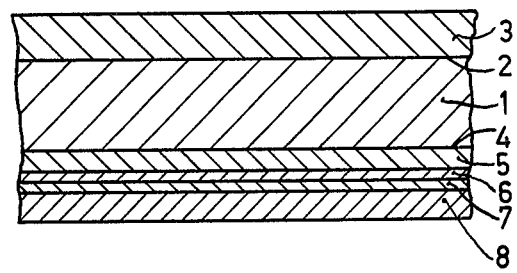
FIG. 1 is a diagrammatic cross-sectional view of a part of a semiconductor device according to the invention.

The first example relates to a diode structure (see FIG. 1) in which a diode 1, 3 is formed in a disk-shaped monocrystalline semiconductor body 1 on a first major surface 2. A second major surface 4 present opposite to the first major surface 2 is covered with an adhesive layer 5 on which metal layers 6 and 7 are provided which are bonded to a carrier 8.

According to the invention the adhesive layer 5 consists of doped amorphous silicon of the same conductivity type as the monocrystalline semiconductor body on the side of the second major surface 4.

During manufacture, the starting point is an approximately 200 $\mu$m thick disk-shaped monocrystalline semiconductor body 1 of the n-conductivity type having a doping of $5.10^{18}$ atoms of antimony per $cm^3$. The monocrystalline silicon body 1 is provided in a conventional manner with a p-type epitaxial layer 3 so that the diode 1, 3 is formed.

A 100 nm thick layer 5 of doped amorphous silicon is provided on the major surface 4 by means of a plasma. The gas mixture in which the plasma is formed comprises silane ($SiH_4$) as a silicon compound and phosphine ($PH_3$) as a compound of the dopant. The deposition is carried out at 300° C. by means of usual apparatus. The phosphorous concentration in the amorphous silicon layer is approximately $4.10^{20}$ atoms per $cm^3$.

After the deposition of layer 5 a thermal treatment is carried out at 650° C. for 30 minutes, phosphorus diffusing from the layer 5 into the body 1.

After a dip-etch for 15 seconds in dilute hydrofluoric acid, metal layers 6 and 7 of palladium and silver, respectively, are provided, after which the layer 7 is bonded to the carrier 8 of molybdenum by exerting pressure.

Layer 3 is provided with a contact in a usual manner and the assembly is then provided with an envelope.

Advantages of the semiconductor device described as compared with known diodes are that the use of more expensive highly arsenic-doped silicon bodies, roughening treatments such as sand-blasting, and expensive treatments such as ion implantation to improve adhesion may be avoided.

Figure 2:
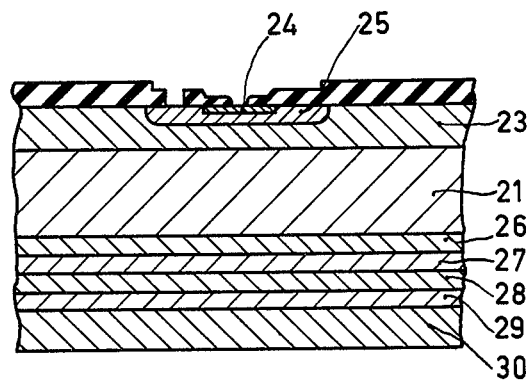
FIG. 2 is a diagrammatic cross-sectional view of a part of another semiconductor device in accordance with the invention.

In another example (see FIG. 2) a disk-shaped monocrystalline silicon body 21 is provided with an epitaxial layer 23 in which a transistor having emitter 24 and base 25 is formed in a usual manner. The adhesive layer 26 consists of doped amorphous silicon, instead of the usual nickel-chromium, provided as described in the preceding example. Conventional nickel and gold layers 27 and 28, respectively, are provided on the silicon layer 26 and are connected to a grid 30 having a gold layer 29.

The semiconductor device is completed in a conventional manner. The amorphous silicon layer 26 has a better adhesion than a nickel-chromium layer and can also be provided less expensively.

It will be apparent that the invention is not restricted to the examples described, but that many variations are possible to those skilled in the art without departing from the scope of this invention.

For example, instead of semiconductor bodies of silicon, semiconductor bodies of III-V or II-VI materials may alternatively be used.

If the semiconductor body is of the p-conductivity type, the amorphous silicon layer can be given the p-conductivity type by generating the plasma in a gas mixture which contains diborane ($B_2H_6$) as a compound of the dopant.

The amorphous silicon layer may also be connected directly to the carrier by means of hard soldering.

What is claimed is:

1. A semiconductor device having a monocrystalline semiconductor body with first and second oppositely-located major surfaces, which comprises:

at least one circuit element formed in said first major surface;

a doped amorphous silicon adhesive layer on said second major surface and of the same conductivity type at that of said monocrystalline semiconductor body at said second major surface;

at least one metal layer on said doped amorphous silicon adhesive layer; and a carrier bonded to the outermost of said metal layer(s) on the doped amorphous silicon adhesive layer.

2. A semiconductor device as claimed in claim 1, wherein said metal layer comprises solder.

3. A semiconductor device as claimed in claim 1 or 2, wherein the concentration of dopant determining the conductivity type of said doped amorphous silicon adhesive layer is larger than the concentration of dopant determining the conductivity type of said semiconductor body at its second major surface.

4. A semiconductor device as claimed in claim 1, wherein metal layers of palladium and then silver are provided on said doped amorphous silicon adhesive layer.

5. A semiconductor device as claimed in claim 1, wherein metal layers of nickel and then gold are provided on said doped amorphous silicon adhesive layer.

* * * * *